(12) United States Patent
Maeda et al.

(10) Patent No.: US 8,960,526 B2
(45) Date of Patent: *Feb. 24, 2015

(54) FLUX FOR SOLDERING AND SOLDERING PROCESS

(75) Inventors: Tadashi Maeda, Kadoma (JP);
Tadahiko Sakai, Kadoma (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 1134 days.

This patent is subject to a terminal disclaimer.

(21) Appl. No.: 10/586,598

(22) PCT Filed: Jan. 27, 2005

(86) PCT No.: PCT/JP2005/001087
§ 371 (c)(1),
(2), (4) Date: Jul. 20, 2006

(87) PCT Pub. No.: WO2005/072906
PCT Pub. Date: Aug. 11, 2005

(65) Prior Publication Data
US 2008/0244900 A1 Oct. 9, 2008

(30) Foreign Application Priority Data

Jan. 29, 2004 (JP) .................................. 2004-021090
Nov. 11, 2004 (JP) .................................. 2004-327440

(51) Int. Cl.
*B23K 1/20* (2006.01)
*B23K 35/02* (2006.01)
(Continued)

(52) U.S. Cl.
CPC ........... *B23K 35/0244* (2013.01); *B23K 35/025* (2013.01); *B23K 35/3006* (2013.01);
(Continued)

(58) Field of Classification Search
USPC ......... 228/178, 179.1, 180.1, 180.21, 180.22, 228/207, 225, 245, 246, 249, 248.1–248.5; 148/23–26
See application file for complete search history.

(56) References Cited

U.S. PATENT DOCUMENTS 5,136,365 A 8/1992 Pennisi et al.
5,837,119 A * 11/1998 Kang et al. ...................... 205/74
(Continued)

FOREIGN PATENT DOCUMENTS

EP 1 178 711 A1 2/2002
JP 51-018245 2/1976
(Continued)

OTHER PUBLICATIONS

Supplementary European Search Report for European Patent Application No. 05 70 9373, which corresponds to the present U.S. application.

*Primary Examiner* — Aaron Austin
*Assistant Examiner* — Megha Mehta
(74) *Attorney, Agent, or Firm* — Wenderoth, Lind & Ponack, L.L.P.

(57) ABSTRACT

There is provided a flux for soldering and a soldering process which form better solder connection without the occurrence of the poor connection nor the insulation degradation.

Such flux which is placed between a solder portion formed on a first electrode and a second electrode when the first electrode is soldered to the second electrode contains:
a liquid base material made of a resin component which is dissolved in a solvent,
an active component which removes an oxide film, and
a metal powder made of a metal of which melting point is higher than that of a solder material which forms the solder portion, and
the flux contains the metal powder in an amount in the range between 1% and 9% by volume based on a volume of the flux.

13 Claims, 6 Drawing Sheets

(51) Int. Cl.
  *B23K 35/30* (2006.01)
  *B23K 35/36* (2006.01)
  *H01L 21/683* (2006.01)
  *H01L 23/00* (2006.01)
  *H05K 3/34* (2006.01)

(52) U.S. Cl.
  CPC ............ *B23K35/3013* (2013.01); *B23K 35/36* (2013.01); *H01L 21/6835* (2013.01); *H01L 24/11* (2013.01); *H01L 24/81* (2013.01); *H05K 3/3489* (2013.01); *B23K 35/3613* (2013.01); *H01L 2224/0401* (2013.01); *H01L 2224/0603* (2013.01); *H01L 2224/11003* (2013.01); *H01L 2224/13099* (2013.01); *H01L 2224/1403* (2013.01); *H01L 2224/16* (2013.01); *H01L 2224/81801* (2013.01); *H01L 2924/01002* (2013.01); *H01L 2924/01004* (2013.01); *H01L 2924/01013* (2013.01); *H01L 2924/01027* (2013.01); *H01L 2924/0103* (2013.01); *H01L 2924/01033* (2013.01); *H01L 2924/01046* (2013.01); *H01L 2924/01047* (2013.01); *H01L 2924/01049* (2013.01); *H01L 2924/01058* (2013.01); *H01L 2924/01078* (2013.01); *H01L 2924/01079* (2013.01); *H01L 2924/01082* (2013.01); *H05K 2201/0215* (2013.01); *H01L 2924/01005* (2013.01); *H01L 2924/01006* (2013.01); *H01L 2924/01019* (2013.01); *H01L 2924/01023* (2013.01); *H01L 2924/0105* (2013.01); *H01L 2924/01087* (2013.01); *H01L 2924/014* (2013.01); *H01L 2224/11822* (2013.01); *H01L 2924/00013* (2013.01); *H01L 2224/131* (2013.01); *H01L 2224/13109* (2013.01); *H01L 2224/13111* (2013.01)
  USPC .......... 228/207; 228/203; 228/205; 228/206; 228/245; 228/248.1

(56) References Cited

U.S. PATENT DOCUMENTS

| | | | |
|---|---|---|---|
| 6,189,771 | B1 * | 2/2001 | Maeda et al. ............... 228/248.1 |
| 6,680,128 | B2 * | 1/2004 | Mei ............................... 428/570 |
| 7,632,710 | B2 * | 12/2009 | Sakai et al. .................... 438/108 |
| 2001/0051535 | A1 | 12/2001 | Kamimura et al. |
| 2002/0185309 | A1 | 12/2002 | Imamura et al. |
| 2004/0026484 | A1 | 2/2004 | Yamashita et al. |
| 2004/0126094 | A1 | 7/2004 | Kotani |
| 2008/0048009 | A1 * | 2/2008 | Maeda et al. ................. 228/208 |

FOREIGN PATENT DOCUMENTS

| | | | | |
|---|---|---|---|---|
| JP | 01-157793 | | 6/1989 | |
| JP | 4-262890 | | 9/1992 | |
| JP | 05212579 | A * | 8/1993 | ............ B23K 35/22 |
| JP | 5-261586 | | 10/1993 | |
| JP | 6-315790 | | 11/1994 | |
| JP | 10-51119 | | 2/1998 | |
| JP | 11-254184 | | 9/1999 | |
| JP | 2000-31210 | | 1/2000 | |
| JP | 2000-135592 | | 5/2000 | |
| JP | 2000-176678 | | 6/2000 | |
| JP | 2002-1581 | | 1/2002 | |
| JP | 2002-224884 | | 8/2002 | |
| JP | 2004-273999 | | 9/2004 | |
| JP | 2004-274000 | | 9/2004 | |

* cited by examiner 1 substrate
2 circuit electrode
3 flux
4 electronic part
5 external connection electrode
6 bump (a)

(b)

(c)

8 metal powder

FLUX FOR SOLDERING AND SOLDERING PROCESS

TECHNICAL FIELD

The present invention relates to a flux which is used upon soldering for example an electronic part onto a substrate and also a process of soldering using such a flux.

BACKGROUND ART

Hitherto, soldering has been used widely as a connecting manner with which an electronic part is mounted to a substrate. For such soldering, various processes are employed such as a solder bump formation process in which metal bumps as connection electrodes of the electronic part are formed of a solder, a solder pre-coating process in which solder layers are formed on electrode surfaces of the substrate, and the like. Recently, in the soldering, a so-called lead-free solder which contains almost or substantially no harmful lead has got to be used in the above mentioned soldering processes from a viewpoint of the environmental conservation.

Since the lead-free solder is greatly different from the conventionally used solder in its components as well as its composition, the conventional flux which is used in the conventional soldering process cannot be used with the lead-free solder. That is, the conventional flux has an activity which is not sufficient for removing an oxide film on a surface of the lead-free solder, so that it is not easy for the conventional flux to ensure a good soldering connection. Therefore, a flux of which activity is increased has been developed for the lead-free solder. See Patent References 1, 2 and 3 as mentioned below.

Also, it has been proposed that a flux contains a large amount of a metal powder for the purpose of providing a metal paste which can be transferred to a solder ball in an sufficient amount. See Patent Reference 4 as mentioned below.

Patent Reference 1: JP Patent Kokai Publication No. 2002-1581
Patent Reference 2: JP Patent Kokai Publication No. 2000-135592
Patent Reference 3: JP Patent Kokai Publication No. 254184/1999
Patent Reference 4: JP Patent Kokai Publication No. 2000-31210

DISCLOSURE OF INVENTION

Problems to be Solved by the Invention

However, when the flux disclosed in the above Patent References which has the increased activity is used, the following defect occurs: In these years, a washing step which was conventionally employed after a soldering step so as to remove the flux used for the soldering with a washing agent has typically got omitted from a viewpoint of the environmental conservation. Thus, the flux used for the soldering remains around the solder connection as it is. When the flux has a high activity, such flux corrodes circuit electrodes of a substrate and/or electrodes of an electronic part, so that insulation of the solder connection is degraded, which leads to a likelihood of insulation failure.

When an electronic part is mounted onto a substrate, the electronic part is forced against the substrate so as to deform solder bumps located between them, followed by melting the solder bumps to form solder connections. In the case wherein the solder bumps are made of a lead-free solder, since a hardness of the lead-free solder is higher than that of the conventional lead-based solder, an extent of the deformation of the solder bumps of the lead-free solder is smaller upon mounting the electronic part, so that a gap is likely to be formed between a lower end of the solder bump and an electrode surface of the substrate when the soldering is carried out. As a result, a molten solder material solidifies without being in contact with the electrode so that the poor connection between the electronic part and the substrate tends to happen.

It is, therefore, an object of the present invention to provide a flux for soldering as well as a soldering process both of which suppress and preferably substantially delete the occurrence of the poor connection and the insulation degradation so as to form better solder connection.

Means for Solving Problems

The present invention provides a flux for soldering which is placed between a solder portion formed on a first electrode and a second electrode when the first electrode is soldered to the second electrode, wherein the flux comprises
  a liquid base material comprising a resin component which is dissolved in a solvent,
  an active component which removes an oxide, and
  a metal powder made of a metal of which melting point is higher than that of a solder material which forms the solder portion, and
  the flux contains the metal powder in an amount in the range between 1% and 9% by volume based on a volume of the flux.

The resin component contained in the flux serves as a so-called binder which keeps the metal powder in its dispersed condition in the flux and also provides a viscosity to the flux such that the flux can be appropriately supplied (for example transferred) to an object (for example the solder portion) and kept there as described later. The oxide which the active component removes is in the form of a film which is formed on a surface of the solder portion. It is particularly preferable that the metal powder has a good wettability with respect to the solder material which forms the solder portion.

The present invention provides a soldering process with which a first electrode having a solder portion thereon is soldered to a second electrode, wherein the process comprises:
  a first step of applying the flux according to the present invention onto at least one of the solder portion and the second electrode,
  a second step of aligning the first electrode with the second electrode so as to locate the solder portion between the solder portion and the second electrode,
  a third step of heating so as to melt the solder portion, and
  a fourth step of solidifying a molten solder material from the solder portion after the third step.

In the third step, the molten solder material which is formed by melting the solder portion wets and spreads over the metal powder and finally reaches and spread over the second electrode so that the molten solder material is present between the first electrode and the second electrode. Thereafter, through the fourth step, the solder material is present in its solid state for example by being cooled, which electrically and mechanically connects the both electrodes.

It is noted that upon aligning the electrodes in the second step, the solder portion may be deformed if necessary, while it remains between the electrodes by applying a force so that the electrodes get close to each other. For example, one electrode is pressed toward the other electrode, so that a coplanarity of the solder portions is improved. In this case, the third step may be carried out while applying the force. In other embodiment, the third step may be carried out without applying the force, and this embodiment is more convenient.

Effects of the Invention

According to the present invention, the flux which contains a predetermined amount of the metal powder as described above and also below in detail is placed between the solder portion and the second electrode, and the solder portion on the first electrode is melted by heating so that the molten solder material spreads over the metal powder and becomes in contact with the second electrode. As a result, the good solder connection is achieved with suppressing the poor connection and the insulation degradation.

LIST OF REFERENCE NUMBERS

Figure 1:
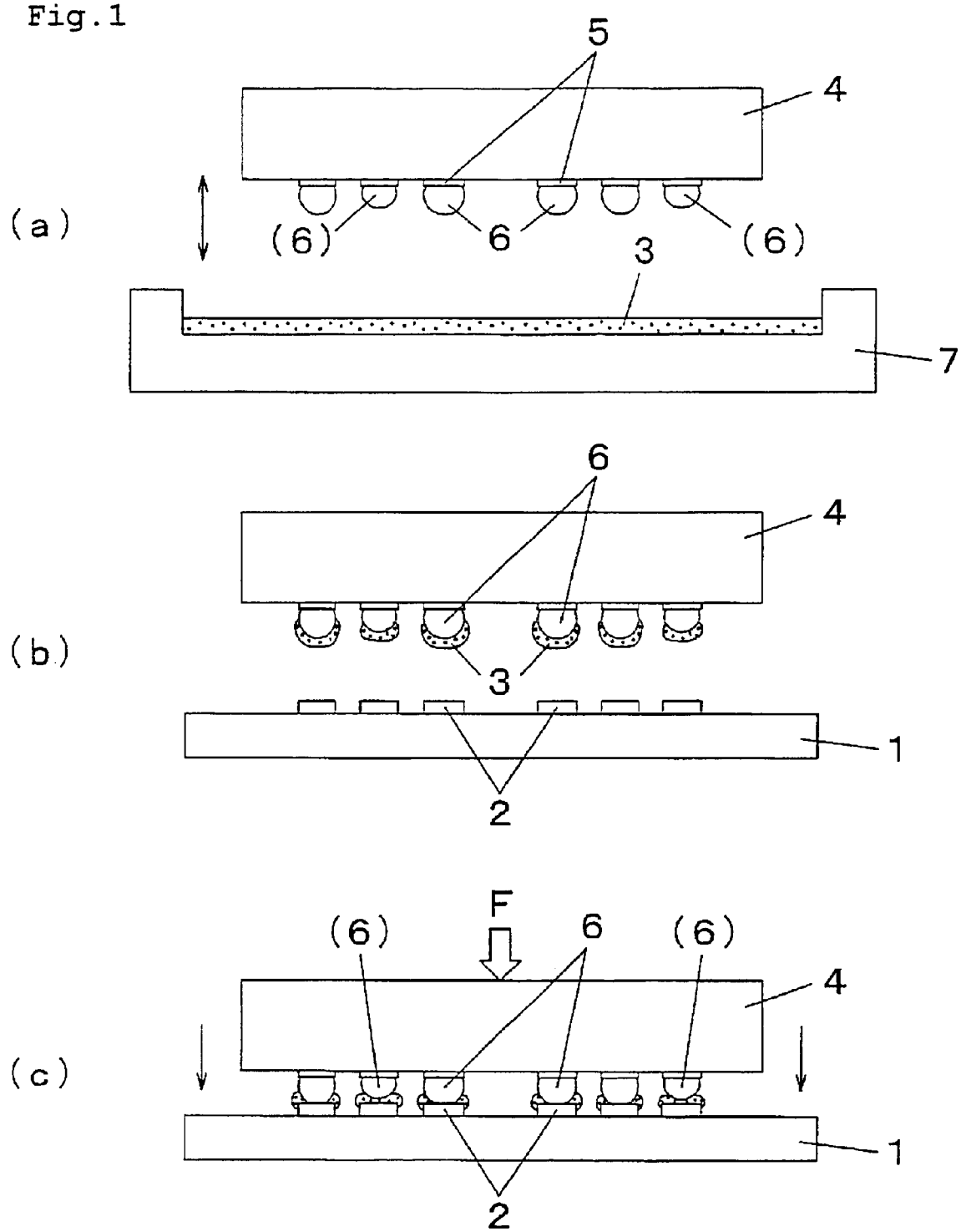
FIG. 1 is an explanatory view which shows the steps of supplying a flux to an electronic part, and then aligning the electronic part with a substrate in an electronic part mounting process as one example of the soldering process according to the present invention wherein soldering is carried out using the flux according to the present invention.

1 substrate
2 circuit electrode (or second electrode)
2a surface of circuit electrode
3 flux
4 electronic part
5 external connection electrode (or first electrode)
6 bump (or solder portion) (6) too low bump
6a molten solder material
7 flux vessel (or transfer table)
8 metal powder
9 dispenser
10 transfer pin
11 mask plate
11a patterned opening
12 squeegee
16 solder connection

EMBODIMENTS FOR CARRYING OUT THE INVENTION

Figure 2:
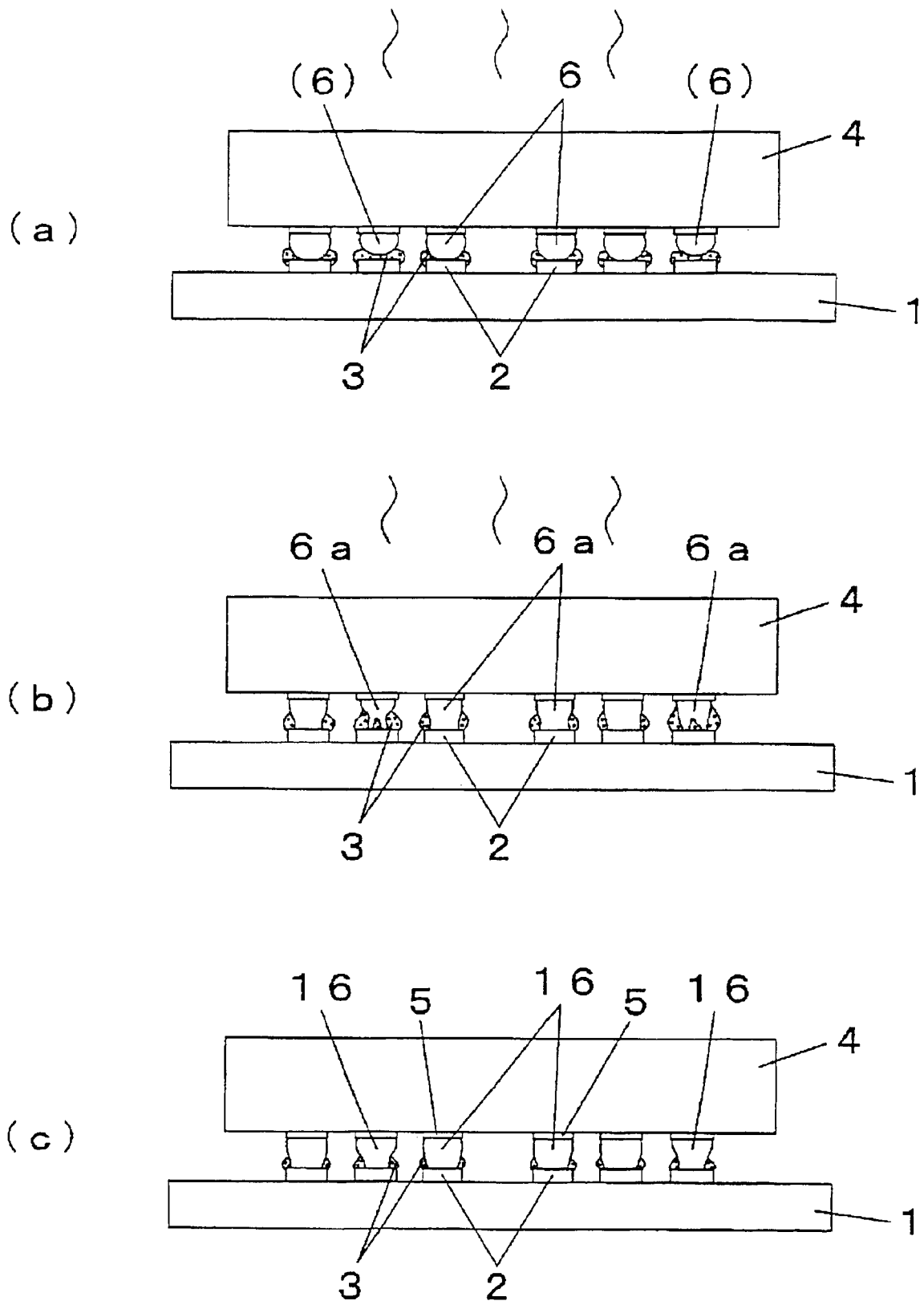
FIG. 2 is an explanatory view which shows the steps of heating the electronic part and the substrate after aligning them, so as to form a solder connection between them in the electronic part mounting process as one example of the soldering process according to the present invention wherein soldering is carried out using the flux according to the present invention.
Figure 3:
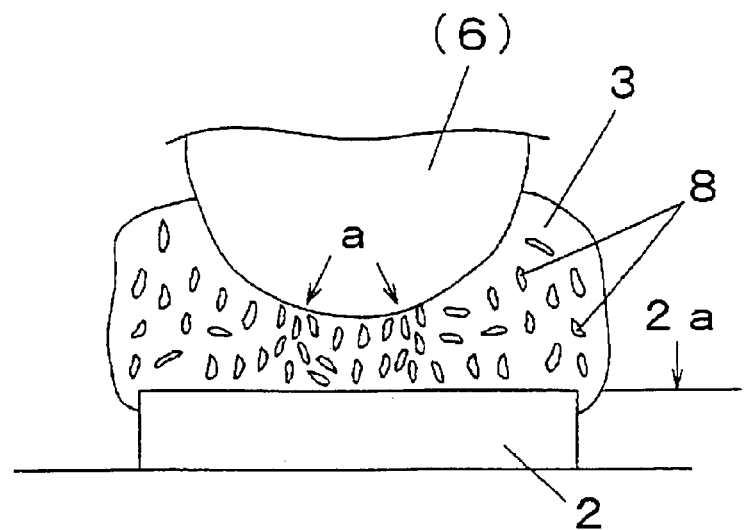
FIG. 3 is a schematic view which explains the processes through which a solder connection is formed when soldering is carried out using the flux according to the present invention.
Figure 3:
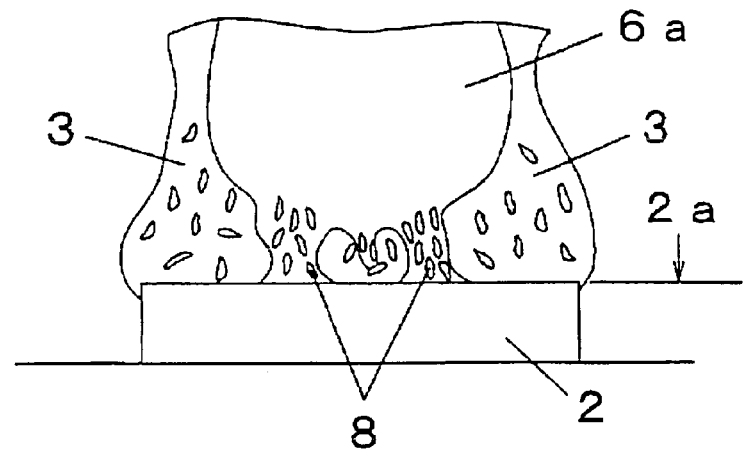
Figure 3:
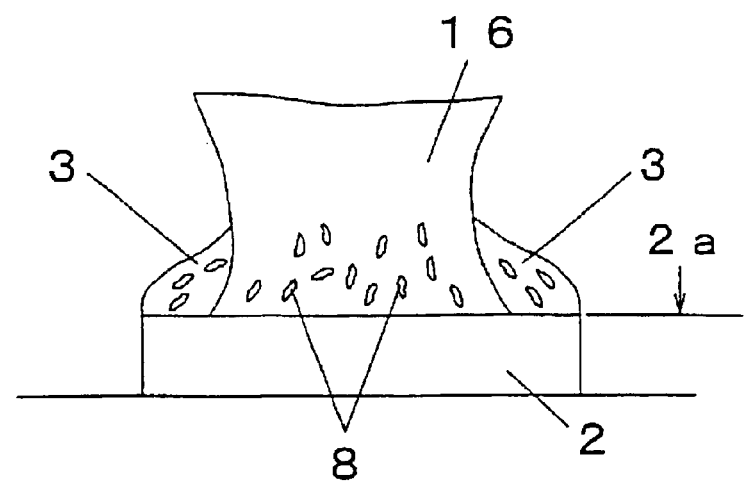
Figure 4:
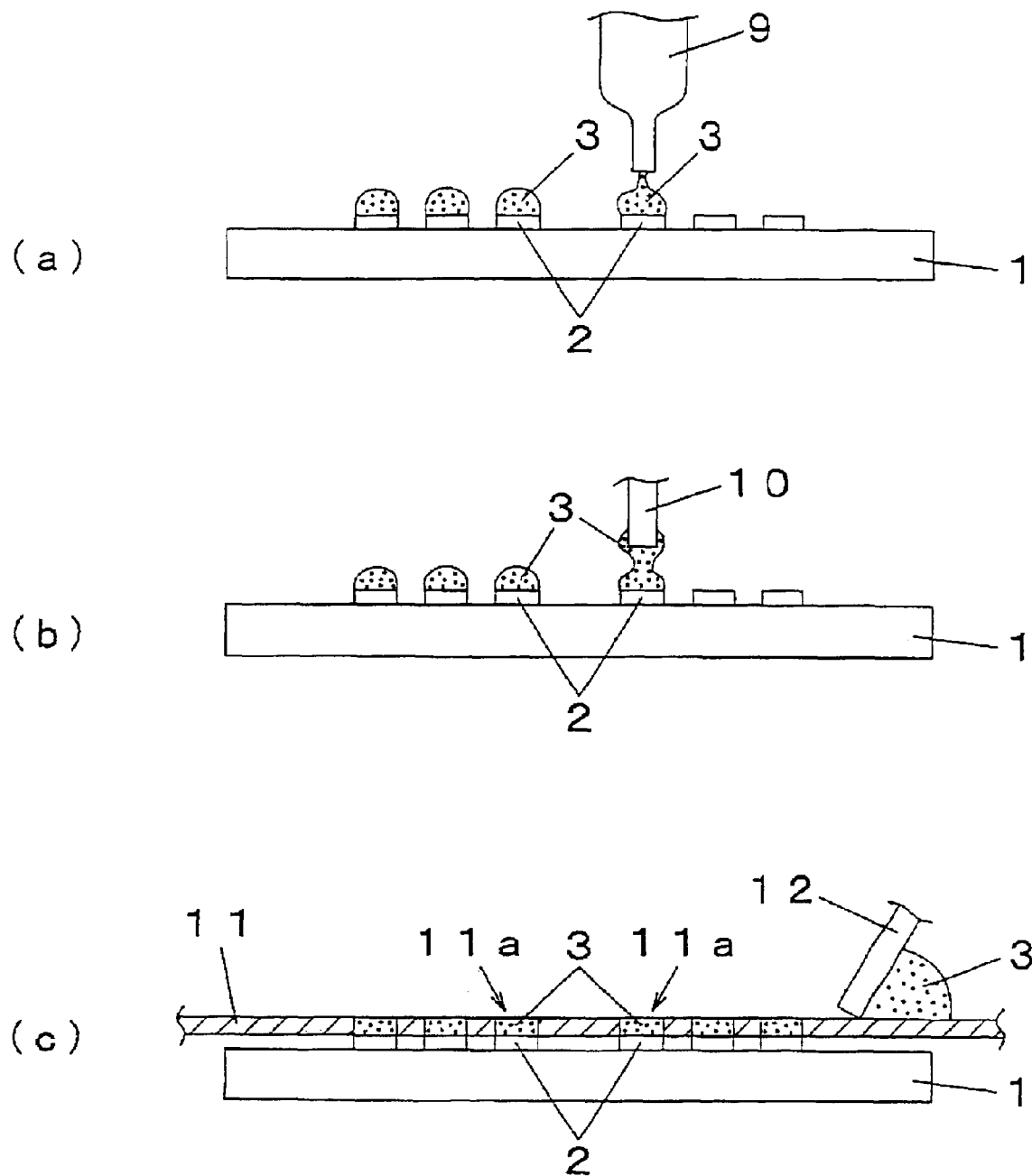
FIG. 4 is a schematic view which explains various manners in which a flux is supplied in the electronic part mounting process as one example of the soldering process according to the present invention.

Then, embodiments according to the present invention will be explained with reference the drawings. FIGS. 1 and 2 explain the steps of a process of mounting an electronic part as one embodiment of the present invention while using the flux according to the present invention. FIG. 3 is an explanatory drawing to explain a process in which the solder connection is formed when the flux of the present invention is used. FIG. 4 is an explanatory drawing which shows various manners to supply the flux in the process of mounting an electronic part as one embodiment of the present invention. Each of the drawings schematically shows when viewing from the side.

First, the soldering process as one example of the present invention will be described by explaining the process of mounting the electronic part using the flux according to the present invention. In the electronic part mounting, an electronic part 4 having an external connection electrode(s) 5 as the first electrode(s) is mounted by means of soldering onto a substrate 1 on an upper surface of which a circuit electrode(s) 2 is formed as the second electrode(s). It is noted that the first electrode and the second electrode may be in any appropriate forms, and for example each of them may be in the form of a pad, land, a portion of wiring, bump or the like. The material for those electrodes may be any known suitable material which is conventionally used for the electrodes.

It is noted that upon using the flux according to the present invention, a portion of the second electrode which the solder portion connects may be concave or flat. Since the connection formed by means of the flux of the present invention has improved insulation as described below, the flux of the present invention is particularly effective when the second electrode is flat or its concave portion is shallow. Also, the flux of the present invention is particularly effective when the second electrode is close to the other electrode or conductor. Therefore, the flux of the present invention is useful, for example when the second electrodes are formed adjacently with a narrow pitch to which the first electrodes are connected respectively.

As shown in FIG. 1(*a*), the electronic part 4 has the external connection electrodes 5 on its bottom surface, and a bump 6 is formed as the solder portion on each of the external connection electrodes 5. The solder portion is a member made of a lead-free solder which is formed on the first electrode 5. The solder portion may be in any appropriate form, and for example it may be in the form of the bump as described above, or any other form such as a coating or the like. It is noted that any known appropriate manner may be used for providing the solder portions. For example, a fusing process of solder balls, a welding or soldering process of solder balls, a plating process, a solder paste printing process, a solder paste dispensing process or the like may be employed.

When the solder portion is in the form of a bump 6 as shown, it is formed by soldering a solder ball in the form of a fine particle to each of the external connection electrodes 5. It is noted that as far as the present invention is concerned, the solder or solder material means a material which uses, as a soldering component, a so-called lead-free solder which is an alloy essentially consisting of a plurality of metals (such as a tin-silver based alloy, a tin-zinc based alloy, a tin-bismuth based alloy, a tin-indium based alloy and the like) which has a low melting point and which contains almost no lead or substantially no lead. Such solder material has a melting point preferably not higher than 240° C. and more preferably not higher than 210° C.

Generally, sizes of the bumps 6 after their formation on the electrodes 5 are not always uniform due to size variation of the solder balls and also a type of manner for the formation, and there may be formed too low bumps of which heights are relatively smaller than a height of the bumps 6 having a predetermined size of the electronic part 4. Such too low bump is indicated with (6) in FIGS. 1(*a*) to 1(*c*). Therefore, positions of the lower ends of the shown bumps are fluctuated vertically and not on the same plane. That is, it is be possible that the coplanarity of the bumps is insufficient.

The flux 3 according to the present invention is applied to the bumps 6 by means of for example transfer, which will be explained below. After the electronic part 4 is lowered toward a transfer table 7 so as to be in contact with a film of the flux 3 formed on the transfer table, the part 4 is moved upward so that the flux 3 is transferred (thus applied) to the lower end portion of the bump 6 as shown in FIG. 1(*b*) (i.e. the first step or flux application step). The flux 3 is used while it is located between the bump 6 and the circuit electrode 2 so as to improve the solder connection upon soldering for mounting the electronic part 4 onto a substrate 1 which will be explained.

The flux 3 according to the present invention is explained. The flux is a composition which is obtained mixing a metal powder 8 into an active component (or activator) and a viscous liquid base material comprising a resin component (such as rosin, a modified rosin, a polyalkylene glycol (for example, a polyethylene glycol), a polyamide resin or the like) dissolved into a solvent (such as butyl carbitol, isopropyl alcohol or the like). The active component is present so as to remove an oxide film which is formed on a surface of the bump 6, and a compound having such oxide film removing function is used. For example, the following are exemplified as the active component: a resin acid (such as abietic acid and the like), an organic acid (such as citric acid, stearic acid and the like), and basic organic compound (such as diethylamine hydrochloride, aniline hydrochloride and the like). It is noted that a material having a low activity which does not require washing after soldering (such as abietic acid or the like) is particularly preferable as the active component in the flux according to the present invention.

Since the rosin and the modified rosin has, in addition to the binder function, the resin acid such as abietic acid which function as the active component, an active component is not necessarily contained additionally by the flux according to the present invention when the rosin or/and the modified rosin is used as the resin component. In this case, such flux is of a low activity, and such flux allows to omit the washing after soldering. However, it is possible that the flux contains an additional or other active component when stronger activity is necessary. Further, when the resin component has no function as the active component as in the case of using the polyethylene glycol or the polyamide, the active component (such as the organic acid, the basic organic compound or the like) is to be contained in the flux according to the present invention.

A material of which the metal powder 8 is made is a metal of which melting point is higher than that of the solder material of the bump 6 as the solder portion, preferably higher by 10° C. or more and more preferably higher by 20° C. or more. Generally, the lead-free solder has a melting point in the range for example between 190° C. and 220° C. As such metal material, a metal is selected such that it is unlikely to form a naturally oxidized film on the surface of the metal powder 8 and has good wettability as to the solder material which forms the bump 6 so that the molten solder material in its flowable state is very likely to spread over the surface of the metal powder 8 while wetting the surface. Concretely, a noble metal such as gold, silver, palladium and the like is exemplified as the metal material which meets the above selection conditions. Particularly, it is more preferable that such metal has a purity of not less than 90%.

Inclusion of the metal powder in the flux 3 is carried out by mixing the metal powder into the other components. An amount of the metal powder to be included is 1% to 9% by volume, preferably 2% to 7% by volume and more preferably 3% to 5% by volume based on the total volume of the flux. It is noted that "% by volume" in the present specification is strictly based on the temperature of 25° C. and the net volume of the metal powder while gaps (or voids) between elements (such as particles, scales or the like) which constitute the metal powder are excluded. That is, "% by volume" does not correspond to "apparent volume" which takes such gaps into account. From a practical viewpoint, the "% by volume" of the metal powder is not substantially affected even when it is based on a general room temperature (20° C. to 30° C.).

Each of the elements which constitute the metal powder may be in the form of any of various particles and other shapes (such as a plate form, a scale form, a flake form, a short fiber form, a dendrite form, a thin piece form, an atypical form and the like), and for example, it may be a spherical form or an atypical form. The element may have an edge portion, a convex portion and/or a concave portion. A bridging function which will be explained below more favorably appears when the elements constituting the metal powder are thin as in the form of the scales, the thin pieces or the flakes, or they are in the dendrite form.

In addition, the metal powder which is used in the flux according to the present invention includes also a metal powder of which constituting elements are metal cores coated with a metal which has the good wettability and of which melting point is higher than that of the solder material of the solder portion. That is, elements which constitute such metal powder is made of a core and a metal coating around the core respectively. For example, a metal powder may be composed of elements each of which is a mass of tin coated with any of gold, silver or palladium each having a purity of not less than 90%. That is, at least a surface of the element is made of a metal having the good wettability as to the solder material of the solder portion as well as a melting point higher than that of the solder material of the solder portion. In other words, the above described conditions for selecting the metal for the metal powder are applicable to the metal which forms the coating.

It is noted that materials which are used as components for the conventional flux can be used for the flux according to the present invention except the metal powder, and amounts of the components in the flux according to the present invention may be generally those as in the conventional flux.

One example of the flux according to the present invention comprises a liquid base material which comprises a resin component (such as rosin) dissolved in a solvent (such as butyl carbitol), an active component (such as abietic acid) which has a function to remove an oxide film formed on a surface of the bump 6, and metal powder 8 having a good wettability as to the solder material of the bump 6 and also having a melting point higher than that of the solder material, and the metal powder is contained in the range between 1% and 9% by volume.

Following the application of the flux, the electronic part 4 is mounted onto the substrate 1. After the electronic part 4 is located on the substrate 1 so as to align the positions of the electrodes to be connected (i.e. after the alignment of the electronic part with the substrate), mounting of the part 4 to the substrate 1 is carried out by heating so as to melt the bumps 6 and also to solder to upper surfaces of the circuit electrodes 2. In this way, the each of the external connection electrodes 2 is electrically connected to the corresponding circuit electrode 5 as predetermined and the electronic part 4 is attached to the substrate 1 through the solder connections formed by the solidification of the molten solder material.

In the above mounting step, the electronic part 4 is placed above the substrate 1, the bumps 6 are aligned with the circuit electrodes 2 and then the part 4 is lowered onto the substrate 1. The bumps 6 having the applied flux thereon are landed on the circuit electrodes 2 so that the flux 3 is placed between the bumps 6 and the electrodes 2 (the second step or electronic part mounting step). It is noted that the electronic part 4 may be pressed against the substrate 1 by applying a predetermined force "F" as shown in FIG. 1(*c*) if necessary, so that bumps 6 each having an average height are deformed in their height direction by the applied force to become lower. As a result, even though the bumps have variation in their heights more or less so that their coplanarity is insufficient, the variation in the bump heights is suppressed, which improves the coplanarity of the bumps so that most of the bumps 6 can contact with the upper surfaces of the circuit electrodes 2. In the case wherein the application of the force is employed, the next solder material melting step may be operated such that the force application is continued, or the applied force is released so that only a tare weight of the part 4 acts on the substrate.

Contrary to the average height bump 6, even when the average height bumps 6 are deformed so that the electronic part 4 as a whole is further lowered by thus deformed amount, a lower end of the too low bump (6) (that is, a bump of which height is too short) still does not contact the upper surface of the circuit electrode 2, so that there remains a gap between the lower end of the too low bump (6) and the upper surface of the circuit electrode 2 (see FIG. 1(*c*)). It is noted that even though there is no large variation in the heights of the bumps 6, there may be formed a gap between the lower end of the bump 6 and the upper surface of the circuit electrode 2 when the electronic part 4 is formed by providing bumps near outer edges of a lower surface of a thin substrate such as a resin substrate which is likely to warp.

The step of melting the bumps 6 and soldering the first electrodes to the circuit electrodes 5 (the third step or solder melting step) after mounting the electronic part will be explained. The substrate 1 on which the electronic part 4 is mounted as shown in FIG. 1(*c*) is heated so as to melt the bumps 6. Such heating may carried out in any suitable manner, and for example the substrate 1 having the electronic part 4 thereon is transferred into a reflow oven to be heated. When heating, the lower ends of the average height bumps 6 are in contact with the circuit electrodes 2 while the flux 3 is present between the lower ends of the too low bumps (6) and the circuit electrodes 2.

Through above heating, the solder connections to the circuit electrodes 2 are provided by means of the bumps 6 as well as the bumps (6). However, during the formation of the solder connections, behaviors of the solder materials of the bumps depend on whether the lower end of the bump is in contact with the circuit electrode 2. As shown in FIG. 2(*b*), in the case wherein the lower end of the bump 6 is in contact with the circuit electrode 2, when the bump 6 is melted by means of heating, the solder material 6*a* in the molten state immediately wets and spreads over the circuit electrode 2 made of a material having a good wettability, so that the external connection electrode 5 is connected with the circuit electrode 2 through the molten solder material 6*a*. At this stage, the active component contained in the flux 3 removes the oxide film formed on the surface of the bump 6 and/or the circuit electrode 2. Thereafter, the solder connections 16 are formed by cooling as shown in FIG. 2(*c*).

To the contrary, as to the bump (6), there is the gap between its lower end and the surface 2*a* of the circuit electrode 2, and it is conceivable that the connection by means of the solder material 6*a* is achieved through the process as shown in FIG. 3. FIG. 3(*a*) shows a state when melting of the bump (6) as the solder portion has started by heating in the reflow oven. With respect to the metal powder 8 in the flux 3 between the lower end of the bump (6) and the surface 2*a* of the circuit electrode 2, a number of elements which constitute the metal powder 8 are present in their random orientations, so that a bridge(s) is likely to be formed from the elements which connects the lower end of the bump (6) and the surface 2*a* of the circuit electrode 2 (see the portions indicated with arrows "a" in FIG. 3(*a*)).

The "bridge (or bridging)" is herein intended to mean a state of the elements of the metal powder 8 are in a close condition to each other, so that they are present as if existing successively in a string of the elements. It is noted that a certain element is separated from other element(s) which is adjacent to said certain element by a short distance, or those elements contact with each other. The close condition is intended to mean a condition of the elements of the metal powder 8 in which an element is separated by a certain distance from other one or more elements which are present next to the former element such that when the flowable solder material which wets and covers over the former element forms a film or mass having a certain thickness because of its surface tension, such film or mass having said certain thickness contacts said other one or more elements. The close condition includes also an embodiment wherein said element is in contact with said other one or more elements.

Because many elements of the metal powder 8 are present in the close condition as described above, an amount of the molten solder material which has contacted with one end of the string of the metal powder elements covers and spreads over an element which is located at the end so as to form a film or a mass having a certain thickness thereon (and preferably to enclose the element), and then thus formed film or mass contacts other element(s) which is adjacent to the former element at the end, and covers and spreads over said other element(s) to form a film or a mass having a certain thickness, which further covers and spreads over further other element(s). In this way, the molten solder material which is formed by melting of the solder portion spreads along the strings of the metal powder elements in the close conditions while wetting them in turn from the elements at one ends of the strings near the solder portion to the elements at the other ends of the strings. By covering and spreading of the molten solder material over the metal powder elements in the form of the strings, the solder material is transferred along the elements, so that it reaches the circuit electrode surface 2*a*. When the transfer of the solder material by means of such spreading over and covering continuously lasts up to the other ends of the strings, the sting of the metal powder elements functions as a bridge which connects the lower end of the bump (6) and the surface 2*a* of the circuit electrode 2 as readily seen when comparing FIG. 3(*a*) with FIG. 3(*b*). Such bridge allows the molten solder material 6*a* to reach the circuit electrode surface 2*a*.

Since the metal having the higher melting point (for example, a noble metal such as gold, silver or the like) than that of the solder portion is used for the metal powder 8 in the flux according to the present invention, it is ensured that the metal powder 8 is present in a solid state even when it is heated to such a temperature that the solder portion get in a molten state. To the contrary, in a soldering process using a cream solder in which solder particles are dispersed, the solder particles are melted simultaneously with heating upon reflow, so that no bridge is formed to connect the lower end of the bump (6) and the surface 2 of the circuit electrode 2a across the gap between them. On the other hand, the flux according to the present invention ensures the formation of the above explained bridge.

As to the flux according to the present invention, it is particularly preferable to use the metal powder elements 8 of the above mentioned metal which have been formed in the form of the scale. In this embodiment, when the elements are oriented in a direction which is perpendicular to a thickness direction of the scale, particularly a longitudinal direction of the element is parallel or nearly parallel to the bridging direction across the gap between the lower end of the bump (6) and the surface 2a of the circuit electrode 2 (i.e. the lengthwise direction of the sheet of FIG. 3), the metal powder 8 is much more likely to form the bridges, so that the bridges are effectively formed even with a relatively lower content of the metal powder in the flux.

When the molten solder material 6a reaches the electrode surface 2a through the bridges as described above, the flowable solder material 6a spreads over the electrode surface 2a having the good wettability. Due to such spreading of the solder material 6a over the electrode surface, the flux near the electrode surface 2a is displaced outside thereof, so that the external connection electrode 5 is connected entirely to the surface of the circuit electrode 2 even when the bump (6) is used which causes the gap between itself and the circuit electrode 2. The same is applicable when the metal powder is made of the thin pieces.

In the above embodiment also, connection is improved by means of the active component contained in the flux 3. The formation of the bridges as described above ensures the good solder connection even when the oxide film on the bump surface is only partly removed, so that the active component contained in the flux 3 does not necessarily have to have a strong activity. In other words, the addition of the metal powder 8 allows to use a flux which contains an active component having a less activity, and in this case, the circuit electrode is unlikely to be corroded by such less active component in the flux even when the flux remains after the formation of the solder connection. Therefore, when the flux according to the present invention is used, reliability of the solder connection can be ensured even in a washing-free soldering process wherein a washing step for the removal of the remaining flux is not carried out.

FIG. 3(*c*) shows a state in which cooling has been carried out in the fourth step or cooling step after completing the heating sequence in the reflow step (solder melting step). That is, the molten solder material 6a which is formed by melting the bump is solidified by cooling, so that the solder connection 16 s formed which connects the external connection electrode 5 and the circuit electrode 2 through soldering. In the solder connection in the vicinity of the electrode surface 2a, the metal powder 8 remains which has been included in the solder material during the soldering process, and such powder may be in the form of an alloy or a solid solution.

It is noted that a flux residue (comprising for example a resin component and an active component) remains on the surface 2a of the circuit electrode 2 and in its vicinity together with an amount of the metal powder which has not been included in the solder connection 16 (see FIG. 3(*c*)). The residue is formed through the evaporation of the solvent component from the flux 3. The flux according to the present invention contains the metal powder in the range between 1% and 9% by volume, preferably between 2% and 7% by volume, and more preferably 3% and 5% by volume as described above. Since such contents are relatively small, poor insulation is very unlikely to occur between electrodes which are adjacent to each other or between an electrode and a wiring after the formation of the solder connections. Particularly, when the active component has a less activity, the poor insulation is much more unlikely to occur. When the poor insulation is caused by the migration, such small contents of the metal powder in the flux according to the present invention are advantageous.

FIG. 2(*c*) shows a state wherein all of the solder connections 16 are formed so as to connect the external connection electrodes 5 with the circuit electrodes 2. As to the combination of the external connection electrodes 5 with the circuit electrodes 2, even the too low bumps (6) which form the gaps between their lower ends and the circuit electrodes 2 allow to effectively carry out soldering when the flux according to the present invention and the soldering process according to the present invention are employed.

In the above, one example of the flux supplying manner is shown in which the flux 3 is supplied to the bumps 6 by transfer in the flux application step, but various other manners may be employed. For example, the flux 3 is supplied onto the electrodes 2 by ejecting the flux with a dispenser 9 as shown in FIG. 4(*a*). In other embodiment, the flux 3 is attached once to a transfer pin 10, and then the attached flux is transferred to the circuit electrodes 2.

In a further embodiment, the flux 3 is supplied onto the circuit electrodes 2 by screen printing as shown in FIG. 4(*c*). That is, a mask plate 11 having predetermined perforated patterned openings 11 which correspond to the circuit electrodes 2 is placed on the substrate 1 and the patterned openings 11a are filled with the flux 3 using a squeegee 12 so as to place the flux 3 on the surfaces of the circuit electrodes 2. It is of course possible to supply the flux to any one of the solder portion and the electrode to be connected, or to the both.

Then, with reference to FIGS. 5 and 6, relationships will be explained between the metal powder content of the flux and connection quality of the solder connection of the bump 6 to the circuit electrode 2 which is formed using the flux.

(Preparation of Flux)

Fluxes were prepared each of which contained a rosin as the resin component (including the active component), an alcohol and benzene as the solvents and further a metal powder in a different content. The weight ratio of the resin to the solvents was 3:2. The metal powder was in the form of the scale and made of silver. The contents of the metal powder in the fluxes were 0.50% by volume, 1.00% by volume, 3.00% by volume, 6.00% by volume, 9.00% by volume and 12.00% by volume, respectively. It is noted that the maximum size averages of the used metal powders were in the range between 5 μm and 20 μm.

In addition, other fluxes were prepared each of which contained a rosin as the resin component (including the active component), an alcohol as the solvent, aniline hydrochloride as an additional (or the other) active component and further a metal powder in a different content. The weight ratio among the resin, the solvent and the additional active component was 20:10:1. The metal powder was in the form of the scale and made of silver. The contents of the metal powder in the fluxes were 0.50% by volume, 1.00% by volume, 3.00% by volume, 6.00% by volume, 9.00% by volume and 12.00% by volume, respectively. It is noted that the maximum size averages of the used metal powders were in the range between 5 μm and 20 μm.

(Mounting of Electronic Part)

Using thus prepared fluxes, a model electronic part 4 were mounted onto a substrate by soldering, and then a poor connection ratio of the solder connection was obtained. The soldering was carried out as explained with reference to FIGS. 1 and 2 in the above. As the electronic part 4, WLCSP (wafer level chip size package having 112 pins with a pitch of 0.5 mm, available from Casio Micronics Co., Ltd.) which had bumps as the solder portions (made of Tin-Silver based lead-free solder, having a bump height of 0.25 mm and a ball diameter of 0.3 mm) on its external connection electrodes was used. It is noted that the bumps at the four corners of the electronic part were intentionally made too low. The height difference of the too low bumps from the other bumps was 0.05 mm. After the electronic part having the flux on the bumps is placed on the substrate while forcing it against the substrate, the substrate was transferred to a reflow oven where soldering was carried out. Other electronic part having the above height difference of 0.1 mm was also mounted.

(Estimation of Connection)

Figure 5:
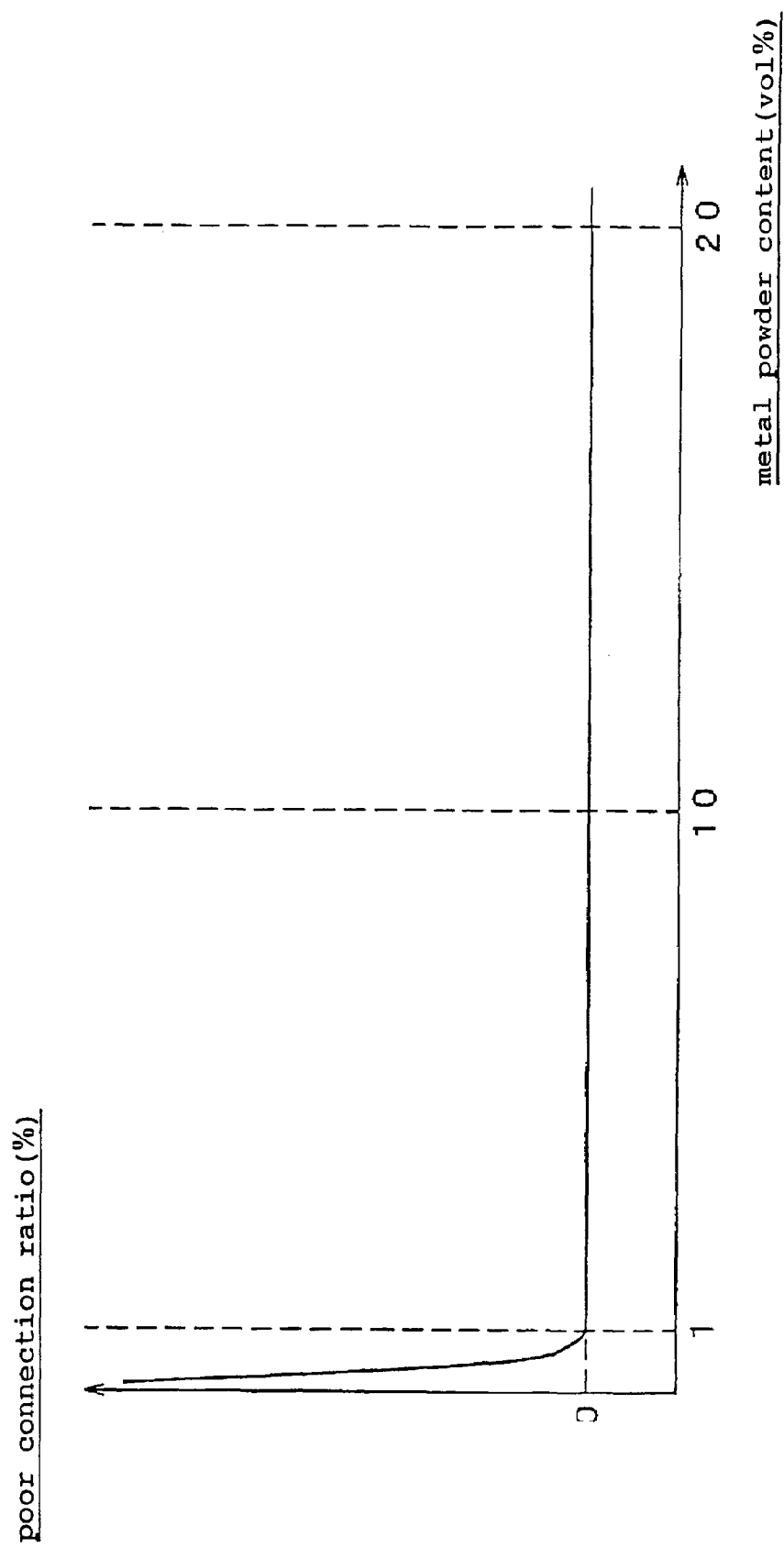
FIG. 5 shows a graph which indicates a relationship between a poor connection ratio and a metal powder content when various fluxes having different metal powder contents were used for forming the solder connections.

FIG. 5 shows a relationship between a metal powder content in the flux and a poor connection ratio, and indicates a frequency in percentage figures of the poor connection occurrence in which a bump 6 has not been connected to a circuit electrode 2 after soldering when various fluxes having different metal powders were used.

As seen from the graph shown in FIG. 5, when almost no metal powder is contained in the flux, the poor connection ratio is large. On the other hand, when the metal powder content is not smaller than 1% by volume, the poor connection ratio is zero at any metal powder content. Therefore, from a view point of the connection quality, the metal powder content is preferably not smaller than 1% by volume.

(Estimation of Insulation)

The solder connections were formed using the fluxes which were prepared as described above, and they were estimated by subjecting them to a voltage application test under a high temperature and a high humidity according to an IPC-Association Connecting Electronics Industries standard, IPC/JEDEC J-STD-020C).

For the estimation, an FR-4 substrate was used, which had a type 2 comb-tooth electrode according to JIS Z 3284.3 on which a pre-coating of a lead-free solder (Sn-3Ag-0.5Cu) was formed to have a thickness of 30 μm. On the solder pre-coating of the substrate, the above prepared flux was applied by screen printing while using a metal mask having perforated patterned openings (each having an opening width of 300 μm and a thickness of 50 μm). The substrate was subjected to a reflow step (preheating temperature: 150 C.° to 170 C.° for 60 seconds, a peak temperature: 240 C.°) so as to simulate a substrate in which soldering has been completed.

Then, the substrate was subjected to the voltage application test under the high temperature and the high humidity test (applied voltage: 20 V, temperature: 85 C.°, humidity: 85%), resistances between the electrodes were measured. FIG. 6 shows a relationship between the metal powder content and the insulation resistance, which indicates the insulation resistances when the metal powder content was changed differently. That is, FIG. 6 shows resistances measured in the voltage application test under the high temperature and the high humidity test which simulates a substrate in which soldering has been completed.

Figure 6:
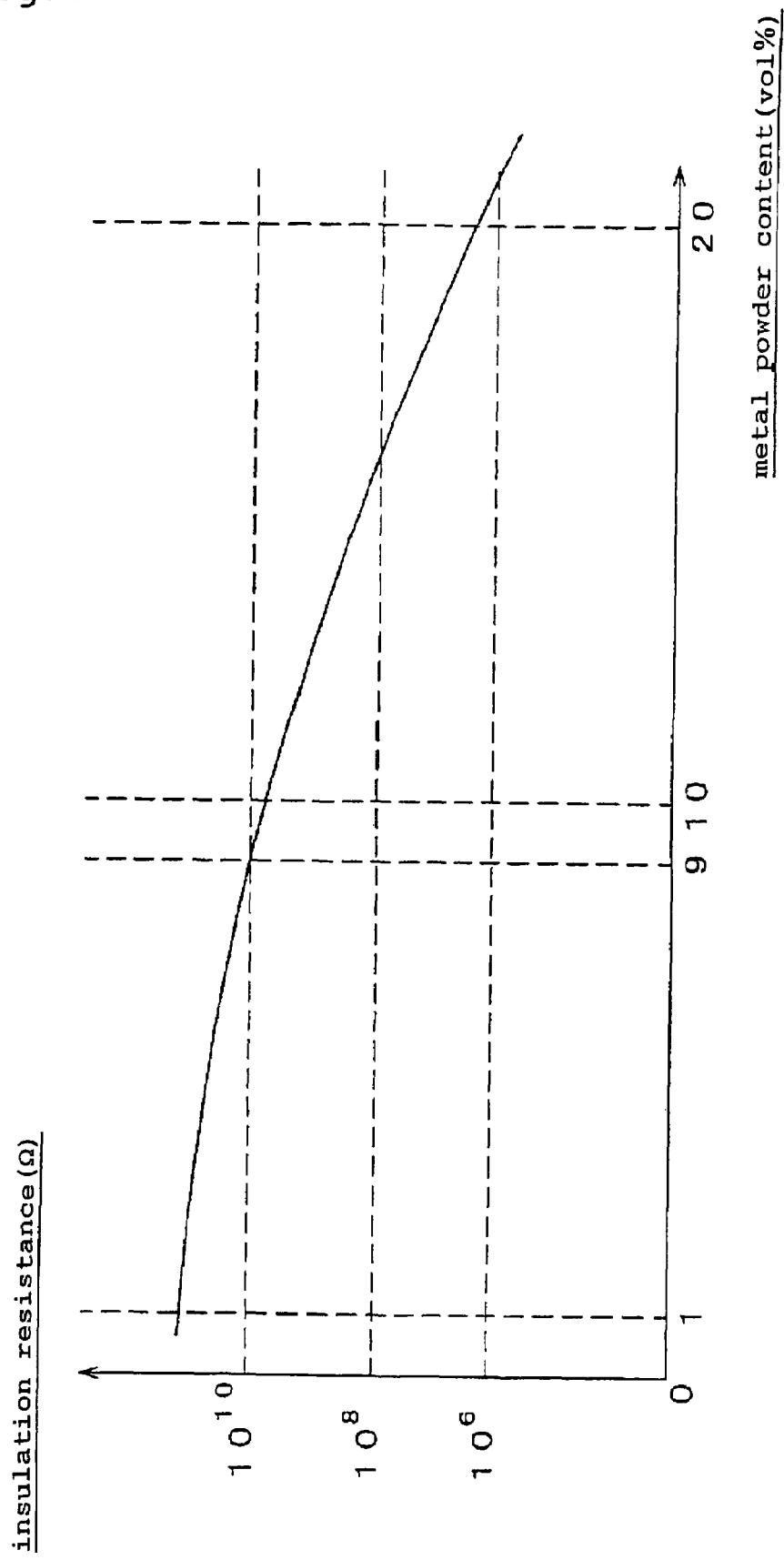
FIG. 6 shows a graph which indicates a relationship between an insulation resistance and a metal powder content after various fluxes having different metal powder contents were used for forming the solder connections.

As seen from the graph of FIG. 6, the insulation resistance decreases when the metal powder content in the flux is increased, which means that excessive addition of the metal powder 8 degrades the insulation after soldering. It is noted that when the insulation resistance is smaller than $10^{10}\Omega$ which is a lower limit of allowable insulation resistance, flux remaining after soldering should be removed by washing the substrate. However, when the metal powder content is not larger than 9% by volume, no washing is required after soldering, which results in that the flux according to the present invention can be used as a washing-free flux (i.e. a flux without necessity of washing).

When a mixing ratio of the metal powder 8 is selected such that the metal powder content in the flux is in the range between 1% and 9% by volume, the washing-free flux 3 is realized which provides high connection qualities in both of the connection and the insulation. As a result, with an electronic part having lead-free solder bumps which are hard and unlikely to be deformed, even though there is a gap between a bump and a circuit electrode due to the variation of the bump sizes, such flux effectively prevents the occurrence of defective mounting wherein such bump is not appropriately connected to the circuit electrode. Further, the flux ensures the good insulation even in the washing-free process wherein a washing step for the removal of the remaining flux after soldering is omitted.

Thus, the soldering process in an electronic part mounting process while using the flux according to the present invention wherein an external connection electrode(s) 5 on which a bump(s) 6 is formed is soldered to a circuit electrode 2, comprises:

the first step of applying the flux 3 according to the present invention to at least one of the bump(s) 6 and the circuit electrode(s) 2, the second step of aligning the bump(s) 6 with the circuit electrode(s) 2 so that the flux 3 is placed between the bump(s) 6 and the circuit electrode(s) 2, the third step of heating and melt the bump(s) 6 so as to make the molten solder material wet and spread over surfaces of the metal powder 8, whereby the molten solder material reaches the circuit electrode(s) 2, and the fourth step of solidifying the molten solder material by cooling it after the third step.

By means of the above soldering process, even when there is a gap(s) between the bump(s) 6 and the circuit electrode(s) 2, the bridge(s) formed by the metal powder 8 surely directs the molten solder material to the circuit electrode(s) 2, so that poor solder connection due the gap(s) is prevented.

It is noted that in the above described embodiment, one example has been explained wherein the first electrode corresponds to the external connection electrode 5 formed on the electronic part 4, the solder portion corresponds to the bump 6 as the solder portion, and the external connection electrode as the first electrode 5 is soldered to the circuit electrode 5 as the second electrode, and that the present invention is not limited to such an example. For example, the present invention is also applicable to an embodiment wherein the first electrode is a circuit electrode formed on a substrate, and the solder portion is a pre-coating of a solder formed on such a circuit electrode.

It is noted that the soldering process which uses the flux according to the present invention makes the washing step of the substrate after soldering unnecessary as explained above. However, in other embodiment, the washing step may be carried out after soldering, and such washing removes the remaining flux so that it further improves the insulation.

INDUSTRIAL APPLICABILITY

The flux according to the present invention makes it possible to provide the high quality solder connection without the poor connection nor the insulation degradation, which is very useful upon the formation of the electric connection by means of the lead-free solder, for example, in the soldering process wherein an electronic part is soldered to a substrate.

CROSS-REFERENCE TO THE RELATED APPLICATIONS

The present application claims the priorities based on Japanese Patent Application Nos. 2004-021090 (filed on Jan. 29, 2004 and entitled "flux for soldering and process of soldering) and 2004-327440 (filed on Nov. 11, 2004 and entitled "flux for soldering and process of soldering). The contents of those applications are incorporated herein by reference in their entirety.

The invention claimed is:

1. A soldering process with which a first electrode having a solder portion thereon is soldered to a second electrode, wherein the process comprises:
   a first step of supplying a flux comprising a liquid base material comprising a resin component which is dissolved in a solvent, an active component which removes an oxide, and a metal powder made of a metal which has a melting point higher than that of a solder material which forms the solder portion, wherein the metal powder is in the form of scales, and the flux contains the metal powder in an amount in the range between 1% and 9% by volume based on a volume of the flux, to at least one of the solder portion and the second electrode,
   a second step of aligning the first electrode with the second electrode so as to locate the flux between the solder portion and the second electrode,
   a third step of heating so as to melt the solder portion, so that a molten solder material from the solder portion comes in contact with the second electrode, and
   a fourth step of solidifying the molten solder material after the third step.

2. The soldering process according to claim 1 wherein the solder portion is a bump which is formed on the first electrode.

3. The soldering process according to claim 1 wherein the first electrode is an external connection electrode of an electronic part.

4. The soldering process according to claim 1 wherein the second electrode is an electrode of a circuit formed on a substrate.

5. The soldering process according to claim 1 wherein supplying the flux is carried out in a flux application step wherein a film of the flux is formed, and then a lower end portion of the solder portion is made in contact with the film.

6. The soldering process according to claim 1 wherein solidifying the molten solder material is carried out in a cooling step wherein the molten solder material is cooled.

7. A soldering process with which a first electrode having a solder portion thereon is soldered to a second electrode, wherein the process comprises:
   a first step of supplying a flux comprising a liquid base material comprising a resin component which is dissolved in a solvent, an active component which removes an oxide, and a metal powder in the form of scales of which constituting elements are comprised of cores and coatings around the cores, wherein the coatings are made of a metal which has a melting point higher than that of a solder material which forms the solder portion, and the flux contains the metal powder in an amount in the range between 1% and 9% by volume based on a volume of the flux, to at least one of the solder portion and the second electrode,
   a second step of aligning the first electrode with the second electrode so as to locate the flux between the solder portion and the second electrode,
   a third step of heating so as to melt the solder portion, so that a molten solder material from the solder portion comes in contact with the second electrode, and
   a fourth step of solidifying the molten solder material after the third step.

8. The soldering process according to claim 7 wherein the solder portion is a bump which is formed on the first electrode.

9. The soldering process according to claim 7 wherein the first electrode is an external connection electrode of an electronic part.

10. The soldering process according to claim 7 wherein the second electrode is an electrode of a circuit formed on a substrate.

11. The soldering process according to claim 7 wherein supplying the flux is carried out in a flux application step wherein a film of the flux is formed, and then a lower end portion of the solder portion is made in contact with the film.

12. The soldering process according to claim 7 wherein solidifying the molten solder material is carried out in a cooling step wherein the molten solder material is cooled.

13. The soldering process according to claim 7 wherein the cores are made of tin and the coatings are made of silver.

* * * * *